United States Patent [19]

Bergna et al.

[11] Patent Number: 5,082,810
[45] Date of Patent: Jan. 21, 1992

[54] CERAMIC DIELECTRIC COMPOSITION AND METHOD FOR PREPARATION

[75] Inventors: Horacio E. Bergna; Salvatore A. Bruno, both of Wilmington; Ian Burn, Hockessin, all of Del.

[73] Assignee: E. I. Du Pont de Nemours and Company, Wilmington, Del.

[21] Appl. No.: 506,966

[22] Filed: Feb. 28, 1990

[51] Int. Cl.$^5$ .................. C04B 35/46; B05D 7/00
[52] U.S. Cl. ................... 501/134; 501/135; 501/136; 501/138; 427/220; 427/376.6; 427/383.5
[58] Field of Search .............. 501/134, 135, 136, 137, 501/138; 106/287.24, 419; 427/62, 63, 79, 220, 376.6, 383.5; 423/598

[56] References Cited

U.S. PATENT DOCUMENTS

| | | | |
|---|---|---|---|
| 3,330,697 | 7/1967 | Pechini | 427/79 |
| 4,579,594 | 4/1986 | Nanao et al. | 106/287.24 |
| 4,668,299 | 5/1987 | Nanao et al. | 106/419 |
| 4,897,378 | 1/1990 | Chiang | 427/63 |

*Primary Examiner*—William R. Dixon, Jr.
*Assistant Examiner*—Paul Marcantoni

[57] ABSTRACT

An improved ceramic dielectric composition comprising a chemically homogeneous distribution of a mixture of additives on the surface of particles of ceramic powder, and to a method for enhancing the dielectric properties and sinterability of such compositions at low firing temperatures.

9 Claims, No Drawings

CERAMIC DIELECTRIC COMPOSITION AND METHOD FOR PREPARATION

BACKGROUND OF THE INVENTION

The present invention relates to an improved ceramic dielectric composition comprising a chemically homogeneous distribution of a mixture of additives on the surface of ceramic powder particles, and, more particularly, to a method for enhancing the dielectric properties and sinterability of such compositions at low firing temperatures.

Ceramic dielectric formulations are used in the fabrication of a wide variety of microelectronic devices. The ceramic formulation must sinter to a dense hermetic body at a temperature below the melting point of a conductor co-fired with the ceramic in the multilayer structure, e.g., below about 1150° C. for a 70% Ag/30% Pd alloy and below 1083° C. for Cu. In the case of copper, the structure must also be fired in a non-oxidizing atmosphere to protect the conductors from oxidation during the sintering process. To achieve a dense hermetic structure when sintering at temperatures below 1150° C., fluxes can be added to the ceramic dielectric formulations. U.S. Pat. No. 4,640,905, for example, describes a manganese doped zinc borate flux, and a low firing ceramic based on barium titanate with a high dielectric constant (K) for use in multilayer ceramic capacitors (MLC's) with Ag/Pd conductors. U.S. Pat. No. 4,845,062 describes a zinc borate frit used as a sintering aid for a magnesium titanate based ceramic in MLC's with copper conductors.

Traditionally, ceramic dielectric powders are prepared by physically blending a mixture of ceramic powders, with or without sintering aids. These ceramic powders can be processed rapidly and economically using readily available equipment to yield relatively dense monolithic bodies and multiphase ceramic bodies. The term "multiphase ceramic bodies" is used herein to refer to ceramic particles of one composition embedded in a matrix of a different composition. In MLC's, for example, a dielectric may contain discrete grains of essentially pure barium titanate in a shell of doped barium titanate or within a glassy matrix. This type of complex structure is difficult to synthesize by other methods. Typically, however, in the traditional blending method, the blend is inherently non-uniform because each component of the mixture has a different particle size distribution, particle morphology and surface properties. As a result, the fired ceramic is chemically non-homogeneous, contains pores and voids, but is tolerable since these deficiencies are smaller than the thickness of the ceramic layer and the scale of the printed circuitry.

Nevertheless, as electronic devices have become smaller and the miniaturization of electronic circuits has progressed, the traditional methods of producing ceramic powders have become inadequate, and the fabricated parts have become unreliable. The scale of the microcircuit elements has approached the scale of these defects.

Several approaches have been proposed to overcome these deficiencies. In one approach, the ceramic layer is created by direct decomposition of a solution of metal compounds, e.g., alkoxides. However, this approach can be slow, cumbersome and unreadily adaptable to mass production. Also, the reliable control of grain size and layer thickness, which are essential to modern electronic devices, can be difficult. U.S. Pat. No. 4,579,594, for example, describes preparation of an inorganic composite material by decomposing a solution containing at least two metals comprising a metal alkoxide oligomer, a metal chelate, a chelating agent and an aldehyde, which solubilizes the metal composition in an organic solvent. This method is inapplicable for coating fine ceramic particles due to binding of small particles and formation of large aggregates, which are unsuitable for production of a smooth ceramic. Moreover, multiphase ceramic bodies, preferred in many electronic applications, are not produced. U.S. Pat. No. 3,330,697 describes a method of preparing alkaline earth and lead titanates, niobates and zirconates by polymerizing the corresponding metal chelates with a polyhydroxy alcohol to yield a uniform distribution of dopants throughout the ceramic particle.

Another approach is described in International Publication Number WO 88/08830, that is, a technique in which differences in particle surface charge cause fine discrete particles of the dopant to associate with a larger ceramic particle. This approach is unsuitable for application of coatings which contain a soluble component. For example, boric oxides or the alkaline earth metal oxides may be desired components of the coating, but would tend to leach out when a filter cake is washed to remove by-product salts such as sodium chloride.

U.S. Pat. No. 3,490,927 describes an approach to bring about a chemical reaction between a desired additive and the surface of the ceramic particle, but is limited to situations where the appropriate reactivity exists between two chemical components. Such reactions tend to be slow and have limited commercial operation. The process involves coating the particle surface of a titanate powder by hydrolyzing a niobium or tantalum alkoxide of a high boiling polyhydroxy alcohol in the presence of a titanate powder.

The deficiencies of traditional blending methods have been overcome by the present invention. Also, the present invention can produce multiphase ceramic bodies which can be difficult to produce by other methods. More particularly, the present invention is an improved ceramic dielectric composition prepared by a process which allows for a distribution of a mixture of additives, including water soluble metal oxides, to be incorporated into a chemically homogeneous coating on the surface of ceramic powder particles.

SUMMARY OF THE INVENTION

The invention relates to an improved ceramic dielectric composition comprising a chemically homogenous distribution of a mixture of additives on the surface of ceramic powder particles, and to a method for enhancing the dielectric properties and sinterability of such compositions at low firing temperatures.

The ceramic powder particles, i.e., primary ceramic component, based on their dielectric properties, have a wide range of K values. The ceramic powders, with high K values in excess of 12, are of a formula $ABO_3$ wherein A is predominantly an alkaline earth metal, lead or mixtures thereof; and B is predominantly titanium, zirconium or mixtures thereof. The ceramic powders, with low K values of 12 or less, are alumina, silica and refractory silicates.

On the surface of the particles is a homogeneous distribution of a mixture of additives, i.e., secondary components, which function as dopants and/or sintering aids selected from the oxides of alkaline earth metals such as barium, calcium, strontium, magnesium and lead oxide; oxides of B site metals such as titanium, zirconium and tin; oxides of rare earth metals such as neodymium, samarium and praseodymium; oxides of metals with a higher charge than titanium such as niobium, tantalum, tungsten, antimony and bismuth; oxides of metals with a lower charge than titanium such as iron, cobalt, chromium, copper, nickel and manganese; and oxides of glass modifier metals such as zinc, silicon, boron, and aluminum and mixtures of the above secondary components.

The process for distributing homogeneously the mixture of secondary components on the surface of the primary ceramic component comprises the following steps:

(a) adding a concentrated stable solution of metal chelates to a dry ceramic powder at a controlled rate while vigorously stirring the mixture below the liquid limit of the powder;

(b) drying and calcining the powder to decompose the metal chelates and remove volatile residues.

The solution of metal chelates is prepared by dissolving a mixture of metal compounds in a concentrated aqueous or aqueous/organic solution of chelating agents. Upon adjustment of the pH, the chelating agent is capable of forming soluble chelates with metal ions. The solution of metal chelates is added at a controlled rate to a dry ceramic powder while vigorously stirring below the liquid limit of the powder to obtain a homogeneous distribution on the surface of the primary ceramic component before the solvent evaporates.

The powder is dried and calcined to decompose the metal chelates and to complete the formation of a homogeneous coating on the primary ceramic component, and removal of volatile residues. The secondary components on the particles of ceramic powder comprises a chemically homogeneous distribution of a mixture of additives that functions as dopants which enhances the dielectric properties, and/or as sintering aids which enhances the sinterability of ceramic powders at low firing temperatures.

The process yields an improved ceramic dielectric composition that can be sintered at low firing temperatures using copper or silver/palladium alloys for printed circuits and electrodes to produce dense, high performance ceramic dielectrics. Moreover, the composition of the present invention is especially useful in preparing dielectric components having very thin dielectric layers, which contain significantly fewer voids and defects, exhibit excellent electrical properties, greater insensitivity to moisture and consistency of electrical properties.

A further aspect of the invention is an improved multilayer ceramic device comprising an assemblage of layers of the improved ceramic dielectric composition and a conductive electrode material and is prepared according to the downstream processing steps described in greater detail in U.S. Pat. No. 4,460,905, the teachings of which are incorporated herein by reference.

Another aspect of the invention is a screen printable thick film composition comprising a homogeneous distribution of secondary components on the surface of the primary ceramic component prepared by the process of the present invention, mixed optionally with uncoated particles, in a volatile solvent.

DETAILED DESCRIPTION OF THE INVENTION

The invention relates to an improved ceramic dielectric composition comprising a chemically homogeneous distribution of a mixture of additives, i.e., secondary components, on the surface of ceramic powder particles, primary ceramic component, and to a method for enhancing the dielectric properties and sinterability of such compositions at low firing temperatures.

The ceramic dielectric powder to which this invention applies has an average particle size from 0.10 microns up to 10 microns. The ceramic powders have a wide range of surface areas and K values. Ceramic powders, with high K values in excess of 12, are of a formula $ABO_3$ wherein A is predominantly an alkaline earth metal, lead or mixtures thereof, and B is predominantly titanium, zirconium or mixtures thereof; and the ratio A/B is preferred to be close to 1.00. By way of example and not limitation, high K ceramics are titanates of Mg, Sr, Ba, Pb and mixtures thereof. The ceramic powders, with low K values of 12 or less, are alumina, silica and refractory silicates and mixtures thereof. For example, cordierite, mullite and anorthite are low K ceramic powders.

The homogeneous distribution of a mixture of additives, i.e., secondary components on the surface of the particles comprise metal oxides selected from, for example, the oxides of the alkaline earth metals such as barium, calcium, strontium, magnesium and lead oxide; oxides of B site metals such as titanium, zirconium and tin; oxides of rare earth metals such as neodymium, samarium and praseodymium; oxides of metals with a higher charge than titanium such as niobium, tantalum, tungsten, antimony and bismuth; oxides of metals with a lower charge than titanium such as iron, cobalt, chromium, copper, nickel and manganese; and oxides of glass modifier metals such as zinc, silicon, boron, and aluminum and mixtures of the above secondary components. The secondary metal oxide components function as dopants and/or as sintering aids. The metal oxides will generally be present in their normal oxidation states, but are not limited to these oxidation states. The metal oxides may also occur as hydroxides or as mixed hydroxide/oxides particularly in the outermost layers of the coatings.

With high K dielectric compositions the ceramic particles should constitute at least 90%, typically up to 99.75%, of the total composition percent by weight. For example, an improved ceramic dielectric composition of the present invention comprises a primary ceramic component of the type $ABO_3$ wherein A is barium that can contain an impurity from 0-2.5 wt % SrO, and B is titanium oxide and 0-4 wt % $ZrO_2$, 0-1 wt % ZnO and 0-2 wt % $Nb_2O_5$, and the secondary components comprise 0-2 wt % ZnO, 0-0.5 wt % $B_2O_3$, 0-0.1 wt % MnO and 0-6 wt % CaO, the mixture of secondary components comprise 0.25-10 wt % of the total composition.

The process for distributing homogeneously the secondary component on the surface of the primary ceramic component comprises the following steps:

(a) adding a concentrated stable solution of metal chelates to a dry ceramic powder at a controlled rate while vigorously stirring the mixture below the liquid limit of the powder; and (b) drying and calcining the powder to decompose metal chelates and remove volatile residues.

A concentrated stable solution of metal chelates is prepared, which comprises a mixture of metal compounds in a solvent with a chelating agent. A chelating agent is referred herein to a polydentate ligand whose structures permit the attachment of two or more donor sites to the same metal ion simultaneously, thus closing one or more rings. A ligand being defined as any atom, ion, or molecule capable of functioning as a donor partner in one or more coordinate bonds. Chelating agents useful in practicing the invention are alpha-hydroxycarboxylic acids, such as lactic, glycolic, malic and citric acid or alpha-aminocarboxylic acids, such as ethylene diamine tetracetic acid (EDTA) and glycine. A concentrated solution of the chelating agent is prepared using a solvent selected from deionized water or mixtures of deionized water with miscible solvents such as methanol, ethanol and isopropanol. The solvent may optionally contain small amounts of wetting agents or surfactants to facilitate dissolution of the metal compounds. It is important that a sufficient amount of chelating agent be added to produce a clear solution of metal chelates. The desired metal compounds are added to the above chelating agent and solvent with stirring. The metal compounds are of the general formula, MXn, wherein M is a metal cation selected from barium, calcium, strontium, magnesium, lead, titanium, zirconium, tin, neodymium, samarium, praseodymium, niobium, tantalum, tungsten, antimony, bismuth, iron, cobalt, chromium, copper, nickel, manganese, zinc, silicon, boron, aluminum and mixtures thereof;

X is an anion or a radical selected from $HCO_2^-$, $CH_3CO_2^-$—, $^-O_2C$—$CO_2^-$, $-OH$, $-OR$, $-NO_3$ and $Cl^-$ and mixtures thereof; and n is a whole number from 2 to 6 depending on the valence state of the metal cation, $M^{+n}$.

The quantity of metal compounds used is determined by the desired ratio of the secondary components to the primary ceramic component in the resulting ceramic dielectric composition. Silica sol may optionally be added as an aqueous silica sol, provided the sol remains stable in the solution of chelated metal compounds. The pH is adjusted in the range of 5 to 10 by the addition of a volatile strong base selected from, for example, ammonium hydroxide, tetramethylammonium hydroxide and trimethylamine. It is preferred the pH be in a range between 5 to 8 whereby a stable solution of metal chelates is obtained. Although the pH is one factor for obtaining a stable solution of metal chelates, other factors include the metal, valence state and the chelating agent. Upon adjustment of the pH, the chelating agent is capable of forming soluble chelates with the metal ions, which are the metal chelates that decompose to metal oxides on the surface of the particles. Although rare, some metal salts may be sufficiently soluble without the addition of chelating agents and these can be incorporated in the solution. It is important that the metal compounds are completely dissolved and a sufficient amount of chelating agent is added to accomplish this. It may be necessary to add chelating agent after the addition of the metal compounds in order to obtain a clear solution. The chelating agents are used to increase the solubility of metal compounds in aqueous or aqueous/organic solvents. The enhanced solubility is needed to adequately coat dry powders below the liquid limit. The liquid limit refers to the water content in weight percent, of a powder comprising ceramic particles at an arbitrarily defined boundary between the liquid and plastic states. The ASTM Standard D4318-84 describes in greater detail the standard test method for liquid limit in reference to soils, and is incorporated herein with reference to powders. Thus, when a plurality of metal oxides is desired, the chelating agents ensure the solubility of all the metal components, while at the same time facilitating the deposition of an homogeneous coating on the surface of the ceramic particle.

The concentrated stable solution of metal chelates is added to a dry ceramic powder at a controlled rate while vigorously stirring so that a homogeneous distribution on the surface of the ceramic particles is achieved before the solvent evaporates. It is desirable to maintain the solvent content below the liquid limit during the process, thus it may be necessary to remove solvent from the chelate solution prior to adding the solution of metal chelates. By proper control of the addition rate and solvent evaporation rate the addition can be completed without ever reaching the liquid limit of the powder, thus insuring a minimum of solvent is used.

Commercial mixers of various types, such as V-blenders, vertical screw ribbon blenders and commercial food processors, for example, the Robot-coupe Model R-2, can be used to achieve adequate agitation. Any type of mixer may be selected as long as thorough blending is achieved. In a typical example, using the Robot-coupe Model R-2, the bowl is loaded with a specified amount of ceramic powder. The bowl is covered, while stirring and a concentrated solution of metal chelate is added at a controlled rate, so that the water content of the powder is kept below the liquid limit. In this way the solution never "floods" the bowl containing the powder and the metal chelates are distributed homogeneously on the surface of the particles. As the solvent evaporates more solution is gradually added to the bowl thus increasing the amount of metal chelates on the surface of the particles. An excessively fast rate of addition will cause flooding and drying of the solution away from the surface of the particles, thus causing non-homogeneous distribution of the metal chelates on the ceramic powder.

Once the addition of solution of metal chelates is completed the powder is kept stirring for some time to accelerate the evaporation of residual water. At this stage powder samples taken from different parts of the bowl are analyzed to ascertain if there is a homogeneous distribution of solvent and metal chelates. The powder is removed from the bowl and drying is completed in an air or vacuum oven. The powder is calcined at 400° to 750° C. to decompose the metal chelates and vaporize the the organic residues, i.e., volatile residues such carbonaceous materials.

The composition of the powders is determined by using X-ray fluoresence (XRF) and an elemental analysis is obtained by atomic emission spectroscopy (AES) using an inductively coupled plasma (ICP) analyzer. The characteristics of the surface coating may be ascertained by transmission electron microscopy (TEM) and energy dispersive spectroscopy (EDS). The secondary components are all in intimate contact with the ceramic particles and are not identified as isolated components. They are present as an amorphous and/or a very fine microcrystalline coating which is distributed homogeneously on the surface of the ceramic particle. The entire particulate surface is not necessarily covered although most of the particles have some coating. The amount of coating may vary from one particle to the next. The various metal oxides are homogeneously distributed throughout the coating and are present in the same relative amounts as were used in the preparation of the compositions. The product is a fine particulate material comprising dielectric ceramic particles partially or completely coated with a homogeneous mixture of additives that functions as dopants and/or as sintering aids.

The resulting powder is calcined to decompose the metal chelates, vaporize volatile residues and generate the metal oxides as a coating on the ceramic powder. In addition to providing enhanced solubility of metal oxides, the useful chelating agents of this invention must be easy to remove from the coated powder by thermal treatment. Residual carbon or carbonaceous material will generally lead to pores and/or blisters in the final ceramic formulation. In general, the carbonaceous materials are conveniently removed by heating in air at 400° C. or higher for at least one hour.

It is a particularly useful aspect of this process that the coated powders are not subject to a washing step thus water soluble metal oxides can be incorporated into the coating and excessive removal of ions from the primary ceramic component is prevented.

The process yields an improved ceramic powder composition that can be sintered at low firing temperatures using copper or silver/palladium alloys for printed circuits and electrodes to produce dense, high performance ceramic dielectrics. Moreover, the improved ceramic powder composition is especially useful in preparing dielectric components having very thin dielectric layers, which have significantly fewer voids and defects, exhibit excellent electrical properties, greater insensitivity to moisture and consistency of electrical properties.

The metal oxide coated dielectric powder composition made by the process of the invention are used to fabricate MLC's and their critical properties, capacitance, dissipation factor and insulation resistance are measured. The procedures for making MLC's and measuring their properties are described in greater detail in U.S. Pat. No. 4,640,905, the teachings of which are incorporated herein by reference. The improved ceramic compositions of this invention are particularly useful in preparing a Z5U or Y5V dielectric of the type described, for example, in U.S. Pat. No. 4,855,266.

A further aspect of the invention is an improved multilayer ceramic device comprising a plurality of dielectric ceramic layers wherein the dielectric ceramic comprises a mixture of additives distributed homogeneously throughout a coating on the surface of particles of ceramic powder; and a plurality of conductive electrodes comprising copper or silver/palladium alloys between the dielectric layers. For example, a MLC is prepared according to the downstream processing steps of:

(a) adding a concentrated stable solution of metal chelates to a ceramic powder at a controlled rate while vigorously stirring the mixture below the liquid limit of the powder;

(b) drying and calcining the powder to decompose metal chelates and remove volatile residues;

(c) casting a dispersion of coated ceramic powder particles, mixed optionally with uncoated particles of ceramic powder, in a solution of binder polymer and a volatile solvent to form a tape casting composition;

(d) placing a thin layer of a tape casting composition on a flexible substrate and heating the cast layer to remove the volatile solvent therefrom to form a green tape;

(e) applying a layer of conductive electrode material dispersed in an organic medium to each of a plurality of layers of green tape;

(f) laminating a plurality of electrode-layered green tape to form an assemblage of alternating layers of green tape and electrode material; and (g) firing the assemblage at 750° C. to 1150° C. to remove the organic medium and organic binder therefrom and to sinter the conductive electrode material and dielectric.

An alternative method for preparing multilayer ceramic devices is by using screen printing techniques, as described in greater detail in U.S. Pat. No. 4,640,905, the teachings of which are incorporated herein by reference. Another aspect of the present invention is directed to a screen-printable thick film composition comprising particles of ceramic powder having a homogeneous distribution of mixed additives on the surface of the primary ceramic component, mixed optionally with uncoated particles of ceramic powder, in a volatile solvent.

The following example serves to illustrate the invention, but is not intended to limit the scope of the invention.

EXAMPLE 1

This example describes the preparation of a concentrated solution of metal chelates and the preparation of a ceramic dielectric powder and its evaluation in multilayer ceramic capacitors.

"Tyzor-LA"[1] (214.5 g 0.368 mole) and ammonium biborate tetrahydrate, (8.25 g, 99%, 0.031 mole) were charged to a 500 ml four-necked flask under a nitrogen atmosphere. The mixture was heated to 90°–95° C. and zinc acetate dihydrate, (40.9 g, 0.186 mole) was added to the solution and the resulting clear solution maintained at 90° to 95° C. for 20 minutes. Calcium acetate hydrate, (61.6 g, 94.52% calcium acetate, 0.368 mole) was added to the solution and the mixture heated at 90° to 95° C. for 30 minutes then at reflux, (105° C.) for 10 minutes so as to dissolve all the solids. Manganese acetate tetrahydrate, (4.26 g, 0.0174 mole) was added and the mixture heated at, reflux, (105° to 107° C.) for 30 minutes. The resulting solution, (326.5 g, 99% yield) was clarified by filtration to give 296.8 g of a clear light yellow metal chelate solution. [1]"Tyzor-LA" is a registered trademark of E. I. du Pont de Nemours and Company, Wilmington, Del. and is a 50% aqueous solution of the lactic acid ammonium salt of chelated titanium.

The composition, calculated as metal oxides was shown by atomic emission spectroscopy (AES), using an inductively coupled plasma (ICP) analyzer, to be the following: Found ZnO, 4.57%; $B_2O_3$, 1.34%; CaO, 6.78%; $TiO_2$, 9.32% and MnO, 0.44%. Theory, ZnO, 4.60%; $B_2O_3$, 1.31%; CaO, 6.26%; $TiO_2$, 8.92% and MnO, 0.373%.

A dry, fine-particle, co-precipitated ceramic powder[2], (1000 g) was charged to a V-Blender. The powder was calcined at 900° C. for 6 hrs. prior to use in this example and the calcined powder had a surface area of 6.8 $m^2/g$, measured by nitrogen adsorption. While maintaining good agitation of the powder, 172.8 g of the concentrated metal chelate solution from Example 1 was added, (6 ml/min) to the ceramic powder in the blender. After the addition was complete the semi-dry powder was allowed to agitate for about 10 min. The material was discharged from the blender, dried and calcined at 700° C. for 3 hrs. The tan solid had a surface area of 6.3 m²/g. ²This co-precipitated powder was made according to the process of Example 7 in U.S. patent application Ser. No. 07/265,295 and has the following composition:

$BaTiO_3$ 86.7 wt %/$BaZrO_3$ 8.7%/$BaZn_{1/3}Nb_{2/3}O_3$ 4.6 wt %

The product was evaluated in multilayer ceramic capacitors (MLC's) according to the procedure described in U.S. Pat. No. 4,640,905. The MLC's had an average dielectric constant (K) of about 28,000, a percent dissipation factor (% DF) of about 4.0 and insulation resistances, IR(25° C.) of about 95,000 and IR (125° C.) of about 4700.

What is claimed is:

1. A process for preparing a ceramic dielectric composition having a homogeneous distribution of a mixture of secondary components on the surface of a primary ceramic particle component comprising the steps of:
   (a) adding a concentrated stable solution of metal chelates to a primary ceramic powder at a controlled rate while vigorously stirring the mixture below the liquid limit of the power for effecting homogeneous distribution of secondary components on the surface; and
   (b) drying and calcining the powder to decompose metal chelates and remove volatile residues.

2. The process of claim 1 wherein the primary ceramic powder is of a formula $ABO_3$ wherein A is predominately an alkaline earth metal, lead or mixtures thereof, and B is predominately titanium, zirconium or mixtures thereof.

3. The process of claim 1 wherein the primary ceramic powder comprises alumina, silica and silicates.

4. The process of claim 1 or claim 2 or claim 3 wherein the solution of metal chelates comprises metal compounds in a solvent with a chelating agent.

5. The process of claim 4 wherein the metal compounds are of the general formula, $MX_n$, wherein
   M is a metal cation comprising barium, calcium, strontium, magnesium, lead, titanium, zirconium, tin, neodymium, samarium, praseodymium, niobium, tantalum, tungsten, antimony, bismuth, iron, cobalt, chromium, copper, nickel, manganese, zinc, silicon, boron, aluminum and mixtures thereof;
   X is an anion or a radical selected from $HCO_2^-$, $CH_3CO_2^-$, $^-O_2C-CO_2^-$, $-OH$, $-OR$, $-NO_3$ and $-Cl$ and mixtures thereof;
   n is a whole number from 2 to 6 depending on the valence state of the metal cation, $M^{+n}$.

6. The process of claim 4 wherein the solvent is deionized water or mixtures of deionized water and water miscible organic solvents, with the optional presence of a small amount of a wetting agent or surfactant.

7. The process of claim 4 wherein the chelating agent is selected from a group capable of forming soluble chelates with a metal cation after adjustment of pH in the range of 5 to 10.

8. The process of claim 7 wherein the chelating agent is selected from the group consisting essentially of alpha-hydroxycarboxylic acid or alpha-aminocarboxylic acid.

9. The process of claim 7 wherein the pH is adjusted to a value in the range of 5 to 10 by adding a base selected from the group consisting essentially of ammonium hydroxide, tetramethylammonium hydroxide or trimethylamine.

* * * * *